(12) United States Patent
Kang et al.

(10) Patent No.: US 8,723,304 B2
(45) Date of Patent: May 13, 2014

(54) SEMICONDUCTOR PACKAGE AND METHODS OF FABRICATING THE SAME

(75) Inventors: In-goo Kang, Bucheon-si (KR); O-seob Jeon, Seoul (KR); Joon-seo Son, Seoul (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 702 days.

(21) Appl. No.: 12/358,566

(22) Filed: Jan. 23, 2009

(65) Prior Publication Data

US 2009/0194859 A1    Aug. 6, 2009

(30) Foreign Application Priority Data

Feb. 4, 2008    (KR) .................. 10-2008-0011059

(51) Int. Cl.
*H01L 23/495*    (2006.01)
(52) U.S. Cl.
USPC ........... 257/690; 257/666; 257/676; 257/678; 257/723; 257/784; 257/E23.031
(58) Field of Classification Search
USPC ............. 257/676, E23.037, E23.04, E23.053, 257/666, 678, 690, 723, 724, 784, E23.031
See application file for complete search history.

(56) References Cited

U.S. PATENT DOCUMENTS

| | | | | |
|---|---|---|---|---|
| 6,225,701 | B1 * | 5/2001 | Hori et al. ...................... | 257/783 |
| 6,307,272 | B1 * | 10/2001 | Takahashi et al. ............. | 257/787 |
| 6,383,659 | B1 * | 5/2002 | Honda et al. .................. | 428/620 |
| 7,195,952 | B2 * | 3/2007 | Vinn et al. ..................... | 438/108 |
| 7,309,399 | B2 | 12/2007 | Lammers | |
| 7,443,014 | B2 * | 10/2008 | Otremba ........................ | 257/676 |
| 2004/0169262 | A1 * | 9/2004 | Oliver et al. .................. | 257/676 |
| 2008/0191342 | A1 * | 8/2008 | Otremba ....................... | 257/723 |

* cited by examiner

*Primary Examiner* — Colleen Matthews
*Assistant Examiner* — William Harriston
(74) *Attorney, Agent, or Firm* — Christensen O'Connor Johnson Kindness PLLC

(57) ABSTRACT

Provided is a semiconductor package having a power device and methods of fabricating the same. The semiconductor package includes a lead frame, a polymer layer component on the lead frame, a metal layer component on the polymer layer component, and a semiconductor chip on the metal layer component. The polymer layer component may include a material formed by adding alumina $Al_2O_3$, an aluminum nitride (AlN), or a boron nitride BN to an epoxy resin. The polymer layer component may have high thermal conductivity and good electric insulating characteristics.

22 Claims, 12 Drawing Sheets

SEMICONDUCTOR PACKAGE AND METHODS OF FABRICATING THE SAME

CROSS-REFERENCE TO RELATED PATENT APPLICATIONS

This application claims the benefit of Korean Patent Application No. 10-2008-0011059, filed on Feb. 4, 2008, in the Korean Intellectual Property Office, the disclosure of which is incorporated herein in its entirety by reference.

BACKGROUND OF THE INVENTION

1. Field of the Invention

The present invention relates to a semiconductor package and methods of fabricating the same, and more particularly, to a semiconductor package having a power device and methods of fabricating the same.

2. Description of the Related Art

In general, a semiconductor package is fabricated by sealing one or more semiconductor chips with a sealing material, such as an epoxy mold compound (EMC), so as to protect the inside thereof, and then the one or more semiconductor chips are mounted on a printed circuit board (PCB).

However, as electronic appliances have been developed to operate at high speeds, to have large capacities, and have been miniaturized, power devices applied to automobiles, industrial equipment, and electric home appliances also need to be manufactured at low cost and become smaller and lighter. At the same time, power devices need to operate with high reliability. Therefore, use of a multi-chip power module package in which a plurality of semiconductor chips are mounted on one semiconductor package is popular.

For example, U.S. Pat. No. 5,703,399 assigned to Mitsubishi discloses a power semiconductor module package. The semiconductor package is constructed in such a manner that a plurality of semiconductor chips, such as a power circuit and a control circuit, are mounted on a lead frame. In the semiconductor package, a sealing material having high thermal conductivity is applied to the bottom of the lead frame, and a heat sink formed of copper is located slightly separated from the lead frame under the lead frame. Accordingly, heat generated by a power circuit chip can be effectively dissipated to the outside.

However, the power semiconductor module package has the following disadvantages. First, the sealing material is filled between a rear surface of the lead frame and the copper heat sink in order to maintain electrical insulating characteristics therebetween. However, while the thermal conductivity of the sealing material is high, it is still less than the thermal conductivity of the lead frame and the copper heat sink, for example, which affects the operating temperature of the semiconductor chips.

Second, since different types of sealing materials are applied on one power semiconductor module package, the process for manufacturing the power semiconductor module package is complicated.

Third, if a plurality of semiconductor chips are mounted on a lead frame, it is difficult to maintain electrical insulation between the semiconductor chips on the lead frame. In particular, this problem becomes serious in the case of a high voltage power device.

In order to solve these problems, a method of fabricating a power semiconductor module package using an insulated substrate, such as a direct bonding copper (DBC) substrate or an insulated metal substrate (IMS), has been introduced.

The DBC substrate is constructed in such a manner that a copper layer is attached to both surfaces of a ceramic layer having high electrical insulating characteristics, and high thermal dissipation characteristics. However, manufacturing costs of the DBC substrate are high.

The IMS is fabricated by forming a polymer insulation layer on an aluminum substrate and then forming a copper layer on the polymer insulation layer according to a designed pattern. Thus, the manufacturing costs of the IMS are lower than those of the DBC substrate. However, the IMS has poor thermal and electrical insulating characteristics.

Accordingly, there is a need to develop a semiconductor package using an insulated structure having low thermal resistivity and high electric resistivity, rather than an insulating substrate, such as the DBC substrate or the IMS, and a method of fabricating the same.

SUMMARY OF THE INVENTION

The present invention provides a semiconductor package employing an insulated structure having high electrical resistivity and low thermal resistivity.

The present invention also provides a method of fabricating such a semiconductor package.

According to an aspect of the present invention, there is provided a semiconductor package comprising a lead frame; a polymer layer component on the lead frame; a metal layer component on the polymer layer component; and a first semiconductor chip on the metal layer component.

The polymer layer component may comprise a material formed by adding one compound selected from a group consisting of alumina ($Al_2O_3$), an aluminum nitride (AlN), and a boron nitride (BN) to an epoxy resin. The polymer layer component includes a polymer layer component having high thermal conductivity and good electric insulating characteristics. The metal layer component may contain copper.

The first semiconductor chip may comprise one of a metal-oxide semiconductor field effect transistor (MOSFET), an insulated-gate bipolar transistor (IGBT), and a diode. The first semiconductor chip may comprise an electrical terminal formed on the top or bottom of the first semiconductor chip to be electrically connected to the outside. An upper surface of the first semiconductor chip may be smaller than an upper surface of the metal layer component.

The semiconductor package may further include an electric connector for electrically connecting the first semiconductor chip to the lead frame and the metal layer component to the lead frame. The electric connector may comprise bonding wire. The electric connector may include one of ribbon wire and a metal clip. The electric connector may be formed of a material selected from a group consisting of gold, aluminum, and copper.

The semiconductor package may further include a sealing material sealing and protecting the polymer layer component, the metal layer component, and the semiconductor chip on the lead frame.

According to another aspect of the present invention, there is provided a method of fabricating a semiconductor package, the method comprising preparing a lead frame; forming a first structure by depositing a first semiconductor chip on a metal layer component; attaching a polymer layer component to the lead frame; attaching the first structure to the polymer layer component; attaching a second semiconductor chip to the lead frame so that the second semiconductor chip contacts the lead frame; and electrically connecting an upper surface of the metal layer component to the lead frame, the first semiconductor chip to the lead frame, and the second semiconductor chip to the lead frame.

The attaching of the polymer layer component may comprise attaching a film type polymer layer component to the lead frame or dispensing a liquid type polymer on the lead frame.

The forming of the first structure may comprise preparing a metal layer; forming a plurality of solder paste components on the metal layer; placing one of a plurality of the first semiconductor chips on each of the solder paste components; performing a reflow process for attaching each of the solder paste components and the plurality of the first semiconductor chips to each other; and performing a singulation process of cutting through the metal layer in order to separate the plurality of the first semiconductor chips from each other.

According to another aspect of the present invention, there is provided a method of fabricating a semiconductor package, the method comprising preparing a lead frame; forming a second structure by sequentially depositing a polymer layer component, a metal layer component, and a first semiconductor chip; attaching the second structure to the lead frame; attaching a second semiconductor chip to the lead frame so that the second semiconductor chip contacts the lead frame; and electrically connecting an upper surface of the metal layer component to the lead frame, the first semiconductor chip to the lead frame, and the second semiconductor chip to the lead frame.

The forming of the second structure may comprise preparing the metal layer; forming a plurality of solder paste components on the metal layer; placing one of a plurality of the first semiconductor chips on each of the solder paste components; performing a reflow process for attaching each of the solder paste components and the plurality of the first semiconductor chips to each other; performing a laminating process for attaching the bottom of the metal layer to a polymer layer; and performing a singulation process of cutting through the metal layer and the polymer layer in order to separate a plurality of the first semiconductor chips from each other.

According to another aspect of the present invention, there is provided a method of fabricating a semiconductor package, the method comprising preparing a lead frame; forming a third structure by depositing a metal layer component on a polymer layer component; attaching the third structure to the lead frame; forming a solder paste component on the metal layer component; placing a first semiconductor chip on the solder paste component; performing a reflow process of attaching the solder paste component and the first semiconductor chip to each other; and electrically connecting an upper surface of the metal layer component to the lead frame, the first semiconductor chip to the lead frame, and the second semiconductor chip to the lead frame.

The forming of the third structure may comprise preparing the polymer layer; preparing the metal layer; performing a laminating process of attaching the polymer layer and the metal layer to each other; and performing a singulation process of cutting through the polymer layer and the metal layer in order to form the polymer layer component and the metal layer component.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
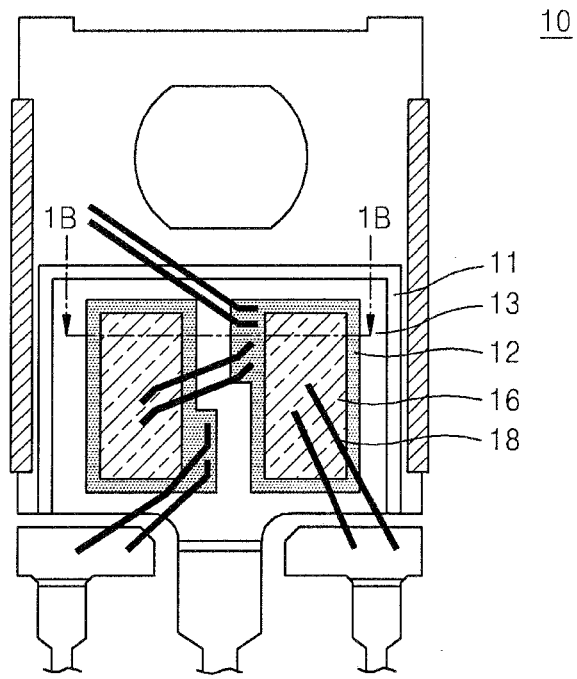
FIGS. 1A and 1B are a plan view and a cross-sectional view of a direct bonding copper (DBC) substrate that substitutes for a polymer layer, according to an embodiment of the present invention.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art. In the drawings, the lengths and sizes of layers and regions may be exaggerated for clarity.

Like reference numerals denote like elements throughout the drawings. It will be understood that when an element or layer is referred to as being "on" another element or layer, the element or layer can be directly on another element or layer or intervening elements or layers. Spatially relative terms, such as "above", "upper", "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "above" can encompass both an orientation of above and below.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms, "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section.

Figure 1B:
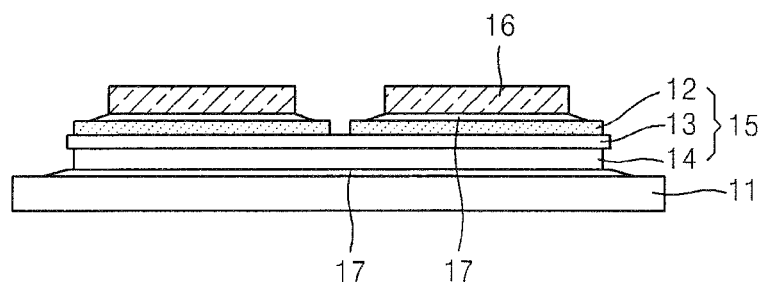

FIGS. 1A and 1B are respectively a plan view and a cross-sectional view of a semiconductor package 10 having a direct bonding copper (DBC) substrate 15 that substitutes for a polymer layer, according to an embodiment of the present invention. Referring to FIGS. 1A and 1B, the DBC substrate 15 is formed on a lead frame 11. A solder paste layer 17 may be between the lead frame 11 and the DBC substrate 15. The DBC substrate 15 is constructed in such a manner that an upper copper layer component 12 and a lower copper layer component 14 are respectively attached to respective surfaces of a ceramic layer 13 having insulating characteristics. Thus, the DBC substrate 15 has good thermal dissipation characteristics. A semiconductor chip 16 is on the upper copper layer component 12. The solder paste layer 17 may be disposed between the upper copper layer component 12 and the semiconductor chip 16. Electrical connections 18 interconnect the semiconductor chips shown in FIG. 1A and the leadframe 11.

However, the manufacturing costs of the DBC substrate 15 are high since a copper layer is partially formed thereon according to a designed pattern. On the other hand, a polymer layer is advantageous in that manufacturing costs thereof are low and it is easy to form an array of polymer layers according to the arrangement of the semiconductor chips.

Figure 2A:
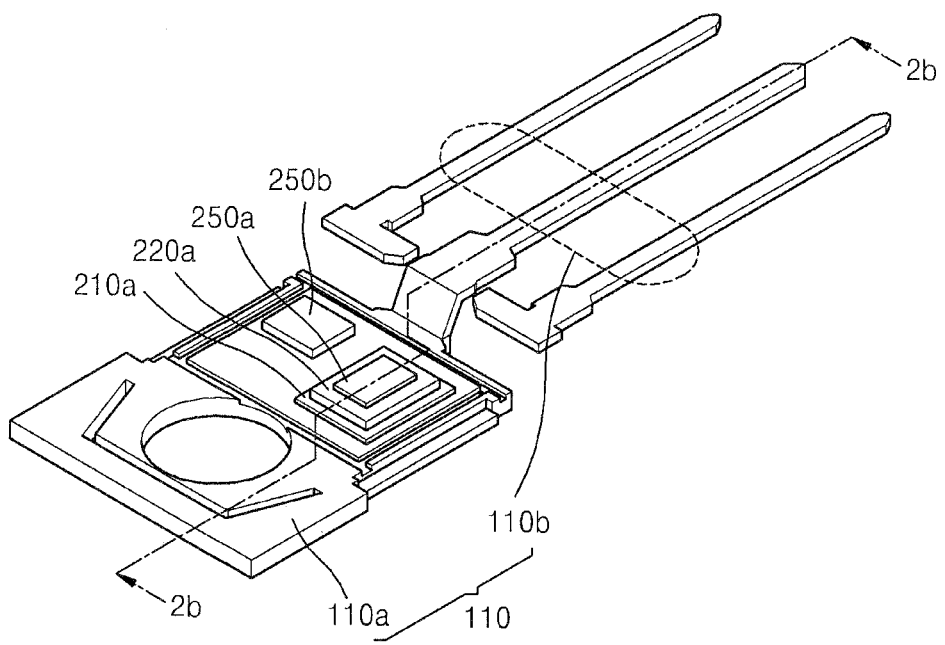
FIG. 2A is a perspective view of a semiconductor package according to an embodiment of the present invention
Figure 2B:
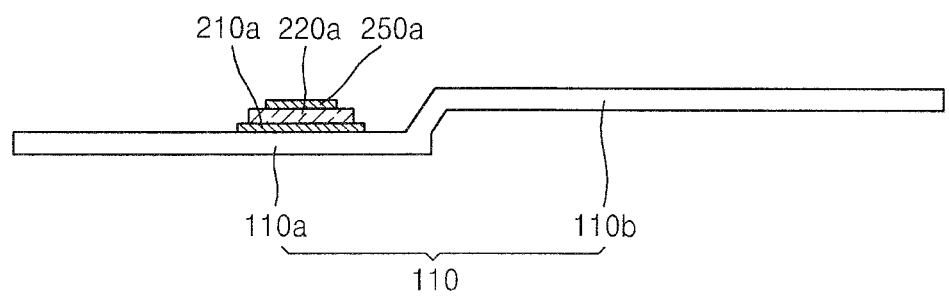
FIG. 2B is a cross-sectional view of the semiconductor package illustrated in FIG. 2A taken along the line 2b-2b.

FIG. 2A is a perspective view of a semiconductor package according to an embodiment of the present invention. FIG. 2B is a cross-sectional view of the semiconductor package illustrated in FIG. 2A taken along the line 2b-2b.

Referring to FIGS. 2A and 2B, in the semiconductor package, a lead frame 110 is provided. The lead frame 110 includes a base plate 110a and leads 110b. The base plate 110a includes a region on which first and second semiconductor chips 250a and 250b are mounted. The leads 110b provide an electrical path to the outside. One of the leads 110b is directly connected to the base plate 110a but the other leads 110b are not connected to the base plate 110a. Referring to FIG. 2A, only the central lead 110b from among three leads 110b is directly connected to the base plate 110a and the left and right leads 110b are not connected to the base plate 110a.

A polymer layer component 210a is attached to the base plate 110a, and a metal layer component 220a is attached to the polymer layer component 210a. Also, the first semiconductor chip 250a is attached to the metal layer component 220a.

The polymer layer component 210a may be formed of a thermal conductive polymer having good thermal conductivity and electric insulating characteristics. In the present invention, it was determined that a polymer containing a material formed by adding an aluminum nitride (AlN) and/or a boron nitride (BN) to an epoxy resin has good thermal conductivity and electric insulating characteristics.

It was determined that a polymer containing a material formed by adding alumina ($Al_2O_3$), an aluminum nitride (AlN) and/or a boron nitride (BN) to an epoxy resin has an electric resistivity of $10^{12}$ to $10^{16}$ Ωcm. The insulating characteristics of the polymer according to the present invention are equivalent to those of general plastic or ceramic.

Also, it was determined that a polymer containing a material formed by adding an aluminum nitride (AlN) and/or a boron nitride (BN) to an epoxy resin has a thermal conductivity of 1 to 10 W/mK. The thermal characteristics of the polymer according to the present invention show a thermal conductivity 5 to 100 times higher than that of general plastic or ceramic.

The metal layer component 220a may contain copper. A solder paste layer component (not shown) may be disposed between the metal layer component 220a and the first semiconductor chip 250a.

The first semiconductor chip 250a may be a power control semiconductor chip and/or a low power semiconductor chip that drives a power control semiconductor chip. For example, the first semiconductor chip 250a may be a silicon-controlled rectifier (SCR), a power transistor, an insulated-gate bipolar transistor (IGBT), a metal-oxide semiconductor field effect transistor (MOSFET), a diode, a power rectifier, a power regulator, an inverter, a passive element, or a combination thereof. Furthermore, the first semiconductor chip 250a may include an electrical terminal, such as a wire bonding pad or chip back side metallization formed on the top or bottom of the first semiconductor chip 250a which may be electrically connected to the outside.

An upper surface of the first semiconductor chip 250a is preferably smaller than that of the metal layer component 220a, so that the upper surface of the metal layer component 220a exposed by the first semiconductor chip 250a can be electrically connected to the lead frame 110. It is also preferable, but not necessary, that the first semiconductor chip 250a be disposed on the center of the metal layer component 220a and the upper surface of the metal layer component 220a be exposed along the circumference of the first semiconductor chip 250a. The exposed upper surface of the metal layer component 220a preferably has an area in which an electric connector can be installed.

According to an embodiment of the present invention, in the semiconductor package, the second semiconductor chip 250b may be mounted on the base plate 110a. The second semiconductor chip 250b may be attached directly to the base plate 110a without the polymer layer component 210a and the metal layer component 220a being disposed therebetween. If the polymer layer component 210a having insulating characteristics is not disposed between the second semiconductor chip 250b and the base plate 110a, the second semiconductor chip 250b is directly electrically connected to the base plate 110a.

The second semiconductor chip 250b may be a power control semiconductor chip and/or a low power semiconductor chip that drives a power control semiconductor chip. For example, the second semiconductor chip 250b may be an SCR, a power transistor, an IGBT, a MOSFET, a diode, a power rectifier, a power regulator, an inverter, a passive element, or a combination thereof. Furthermore, the second semiconductor chip 250b may have an electrical terminal formed on the top and/or bottom of the second semiconductor chip 250b which may be electrically connected to the outside.

According to an embodiment of the present invention, the semiconductor package may further include an electric connector that electrically connects either the semiconductor chips 250a and 250b to the lead frame 110, or the metal layer component 220a to the lead frame 110. The electric connectors may be bonding wire, ribbon wire, or a metal clip, and may be formed of gold, aluminum, or copper. The electric connectors may be encapsulated in a sealing material on the lead frame 110. The sealing material, if present, seals the polymer layer component 210a, the metal layer component 220a, the semiconductor chips 250a and 250b, and the electric connector so as to protect them. For example, the sealing material may be an epoxy mold compound (EMC).

Figure 6A:
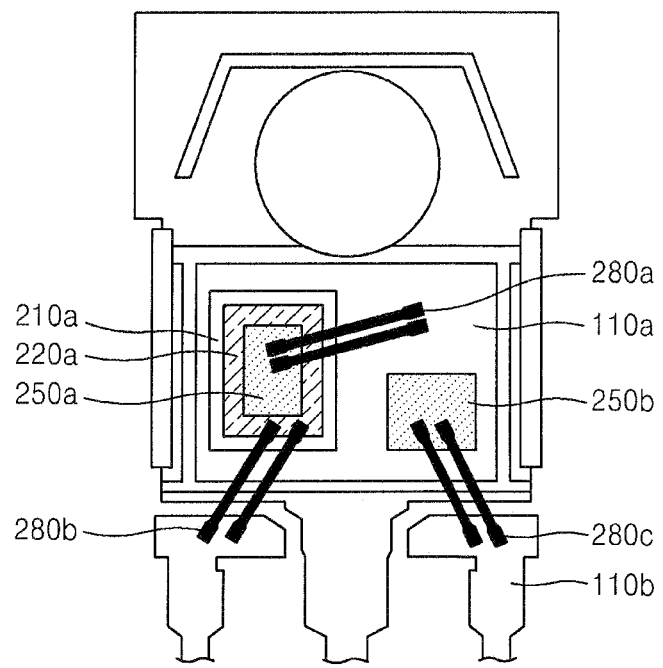
FIGS. 6A and 6B are a plan view and a perspective view of a semiconductor package having bonding wires, according to an embodiment of the present invention.
Figure 6B:
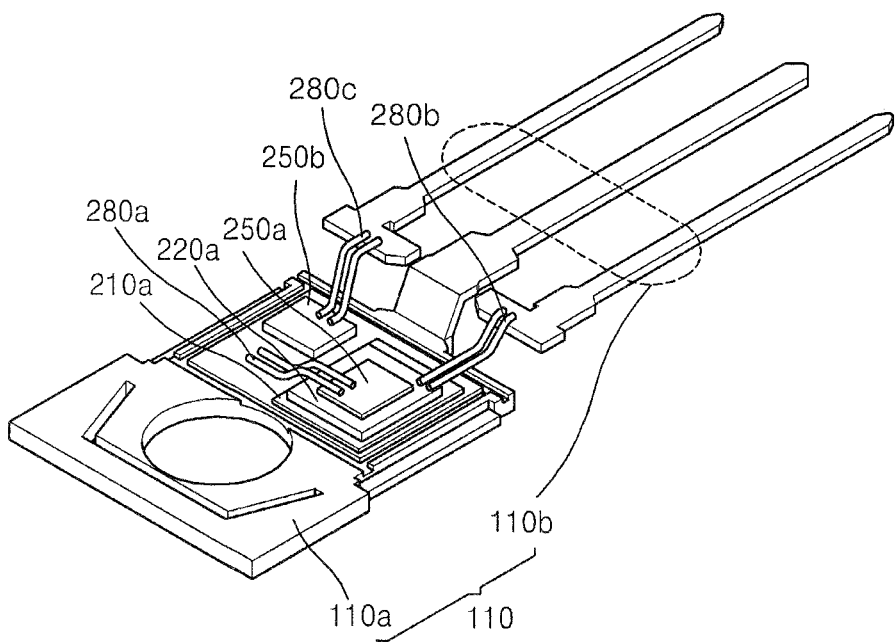

FIGS. 6A and 6B are a plan view and a perspective view of a semiconductor package having bonding wires 280a, 280b and 280c according to an embodiment of the present invention.

Hereinafter, for convenience of explanation, a lead that extends from a base plate 110a and is directed connected to the base plate 110a of the leads 110b, will be referred to as a 'first lead', and the other leads 110b not directly connected to the base plate 110a will be referred to as 'second leads'.

Still referring to FIGS. 6A and 6B, a first semiconductor chip 250a and the base plate 110a may be electrically connected via first bonding wire 280a. A metal layer component 220a and one of the second leads 110b may be electrically connected via second bonding wire 280b. The second semiconductor chip 250b and the other second lead 110b may be electrically connected via third bonding wire 280c.

Since the first semiconductor chip 250a and the metal layer component 220a are electrically connected, the first semiconductor chip 250a is electrically connected to the base plate 110a via the first bonding wire 280a and is electrically connected to one of the second leads 110b via the second bonding wire 280b.

The second semiconductor chip 250b is not electrically connected to the base plate 110a via a bonding wire, and is electrically connected to the other second lead 110b via the third bonding wire 280c.

Figure 7:
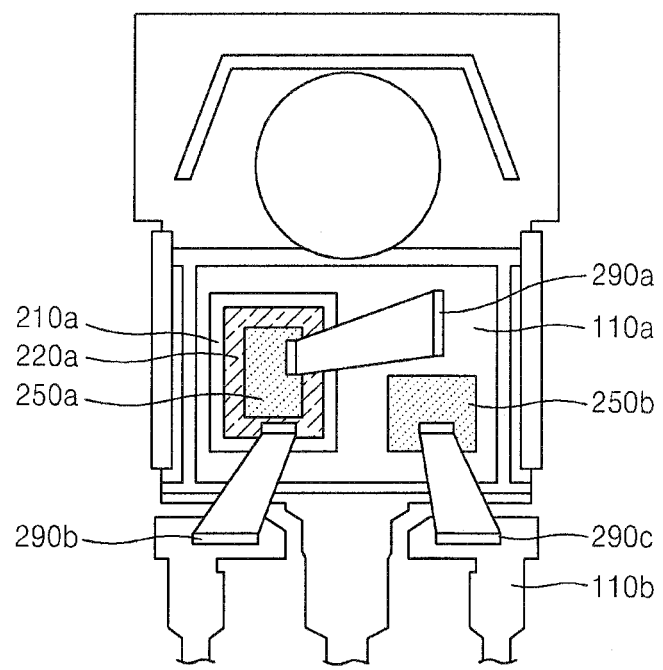
FIG. 7 is a plan view of a semiconductor package having a metal clip, according to another embodiment of the present invention.

FIG. 7 is a plan view of a semiconductor package having metal clips 290a, 290b, and 290c according to another embodiment of the present invention. Referring to FIG. 7, a first semiconductor chip 250a and a base plate 110a may be electrically connected via a first metal clip 290a. The metal layer component 220a and one of second lead 110b may be electrically connected via a second metal clip 290b. The second semiconductor chip 250b and the other second lead 110b may be electrically connected via a third metal clip 290c.

A first semiconductor chip 250a and a metal layer component 220a are electrically connected. Thus, the first semiconductor chip 250a is electrically connected to the base plate 110a via the first metal clip 290a and to one of the second leads 110b via the second metal clip 290b.

The second semiconductor chip 250b is electrically connected to the base plate 110a without a metal clip, and is electrically connected to the other second lead 110b via the third metal clip 290c.

Bonding wire or a metal clip that has been described above as an electric connector is illustratively provided in order to describe embodiments of the present invention, and thus, the present invention is not limited thereto. For example, the electric connectors may be embodied as ribbon wire.

Figure 3A:
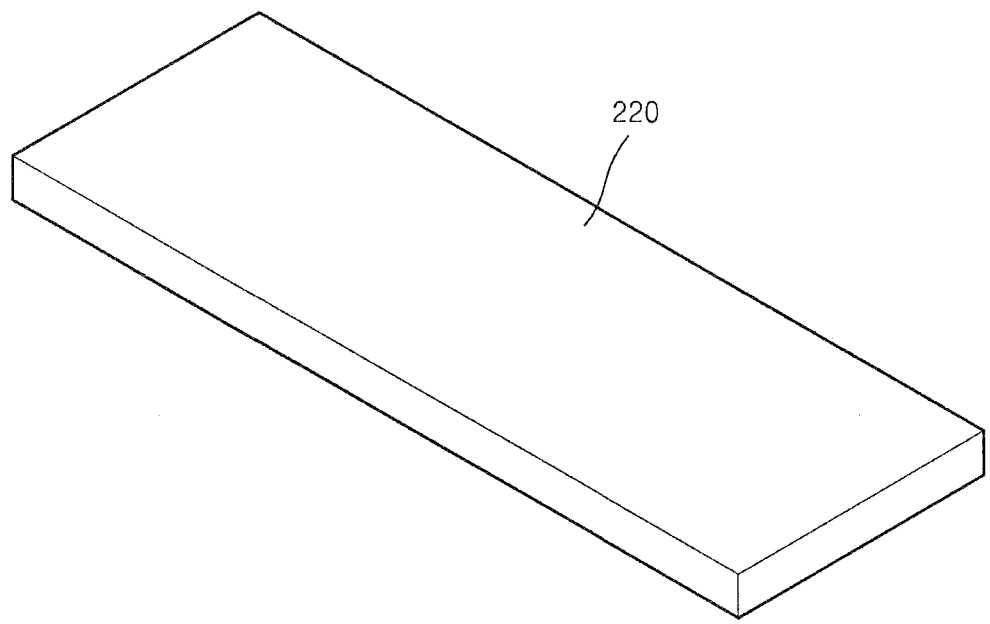
FIGS. 3A through 3G are perspective views illustrating a method of fabricating a semiconductor package according to an embodiment of the present invention.

FIGS. 3A through 3G are perspective views illustrating a method of fabricating a semiconductor package according to an embodiment of the present invention. Referring to FIG. 3A, a metal layer 220 is prepared. The metal layer 220 may contain copper. A part of the metal layer 220 is formed as a metal layer component 220a in a subsequent process.

Figure 3B:
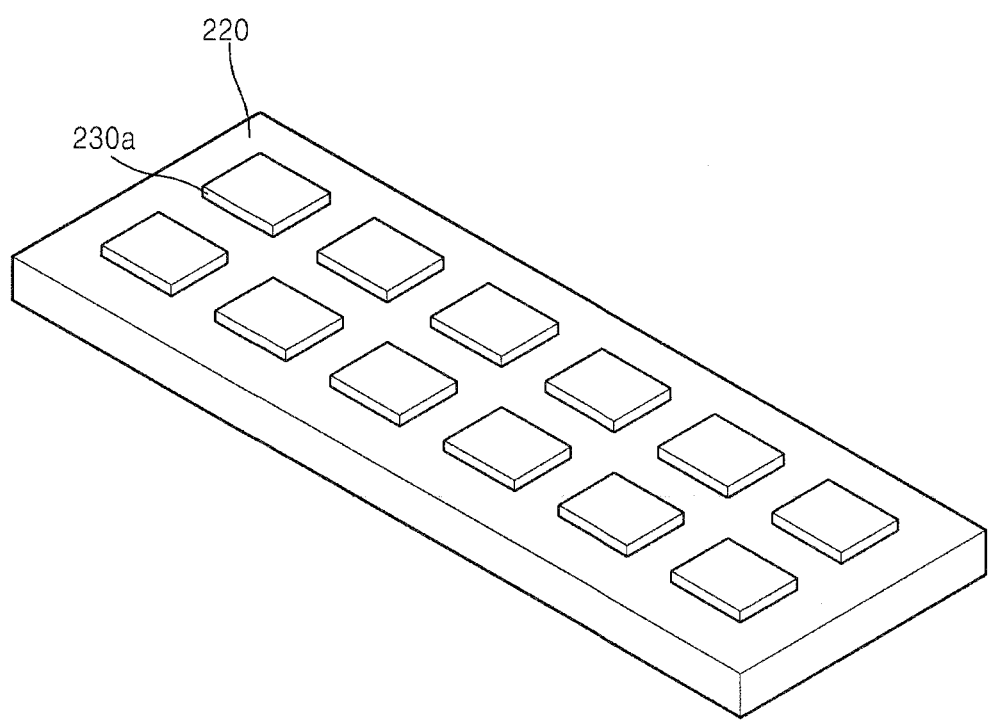

Referring to FIG. 3B, solder paste components 230a are formed on the metal layer 220. The solder paste components 230a may be arranged to form an array of semiconductor chips in a subsequent process.

Figure 3C:
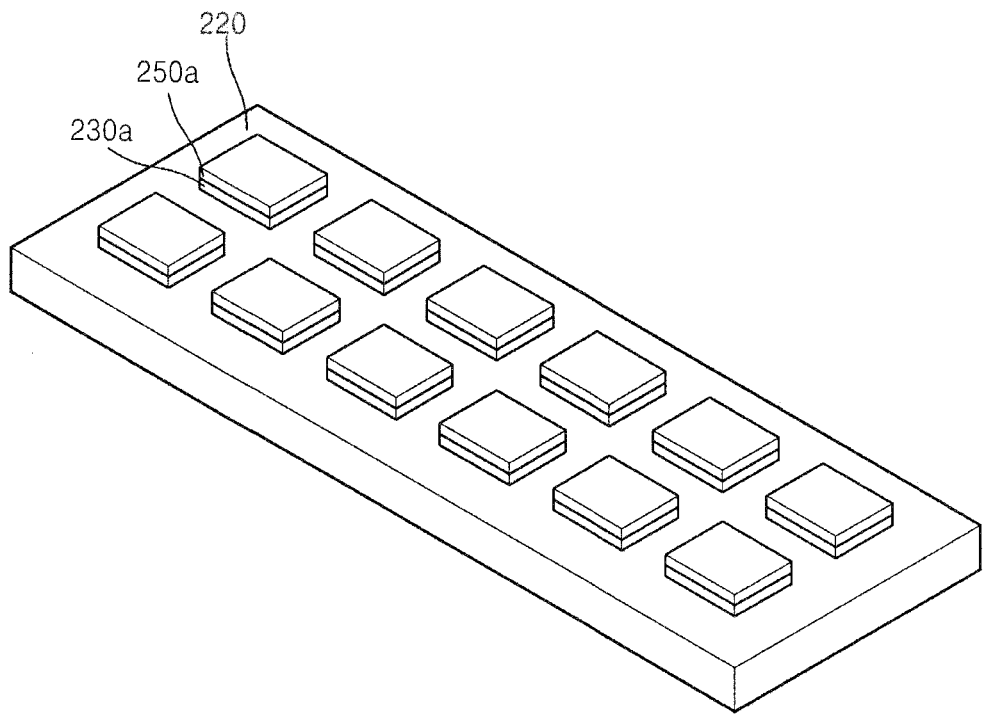

Referring to FIG. 3C, a first semiconductor chip 250a is placed on each of the solder paste components 230a. Next, a reflow process is performed so that the componentmetal layer 220 and the first semiconductor chips 250a are attached to each other.

Figure 3D:
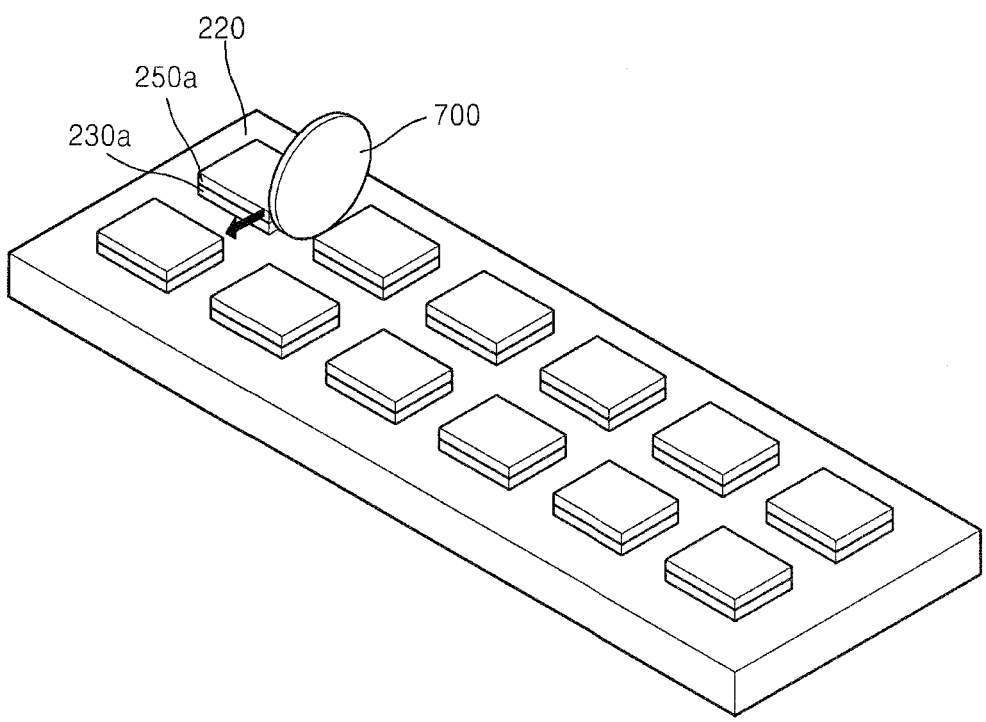

Referring to FIG. 3D, a singulation process is performed to cut through the metal layer 220 in order to separate the first semiconductor chips 250a from each other. The singulation process includes a process of cutting the metal layer 220 between the semiconductor chips 250a in the vertical and horizontal directions using a cutting device 700. The cutting device 700 may use a laser beam.

Figure 3E:
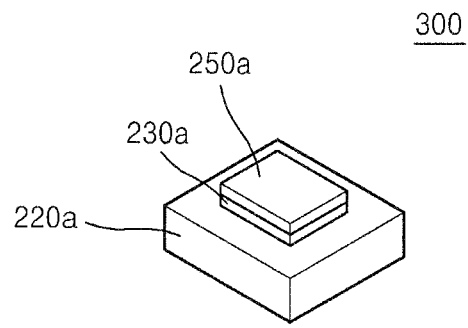

Referring to FIG. 3E, a first structure 300 includes the first semiconductor chip 250a disposed on the metal layer component 220a after performing the singulation process. The solder paste component 230a may be disposed between the metal layer component 220a and the first semiconductor chip 250a.

Figure 3F:
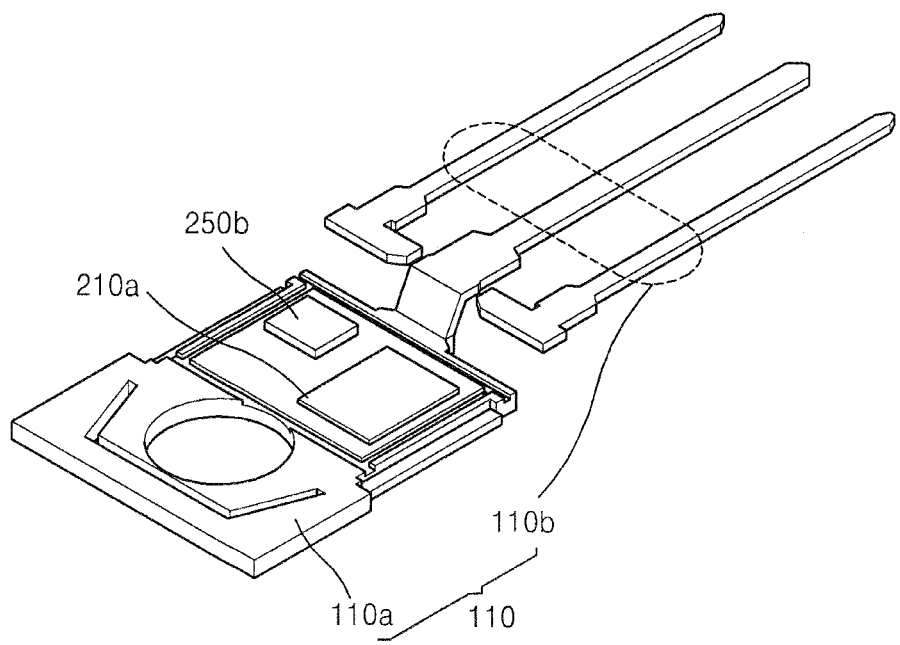

Referring to FIG. 3F, a lead frame 110 is prepared. The lead frame 110 includes a base plate and leads 110b. The base plate 110a includes a region on which semiconductor chips 250a and 250b are to be mounted. The leads 110b provide an electric path to the outside. Hereinafter, for convenience of explanation, a lead 110b which extends from the base plate 110a and is directly connected to the base plate 110a from among the leads 110b, is referred to as a first lead 110b, and the other leads 110b not directly connected to the base plate 110a are referred to as second leads 110b. Referring to FIG. 3F, a central lead 110b that extends from and is thus directly connected to the base plate 110a from among three leads 110b, is the first lead 110b, and the other leads 110b that are adjacent to the left and right sides of the first lead 110b and not directly connected to the base plate 110a, are the second leads 110b.

A polymer layer component 210a is attached to a region of the base plate 110a. The polymer layer component 210a may be a previously prepared film type polymer layer component mounted on the base plate 110a or may be dispensed as a liquid type polymer on the base plate 110a.

The second semiconductor chip 250b may be mounted on the base plate 110a. The polymer layer component 210a having insulating characteristics is not disposed between the second semiconductor chip 250b and the base plate 110a. Thus, the second semiconductor chip 250b may be electrically connected to the base plate 110a.

Figure 3G:
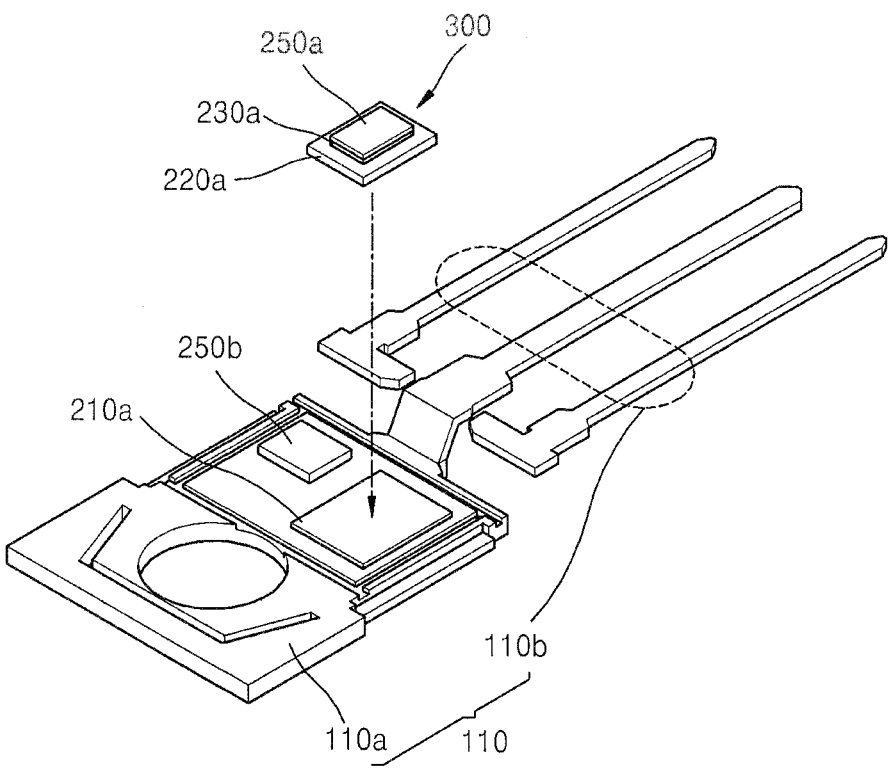

Referring to FIG. 3G, the first structure 300 is mounted on and attached to the polymer layer component 210a. More specifically, the first structure 300 is mounted on the polymer layer component 210a and a curing process is performed on the resultant structure in order to attach the first structure 300 to the polymer layer component 210a.

Then, electric connections may be formed. That is, the first semiconductor chip 250a and the base plate 110a may be electrically connected via a first bonding wire. The metal layer component 220a and one of the second leads 110b may be electrically connected via a second bonding wire. The second semiconductor chip 250b and the other second lead 110b may be electrically connected via a third bonding wire. The bonding wire may be replaced with a metal clip or ribbon wire.

Thereafter, a sealing material may be formed on the lead frame 110. The sealing material seals the polymer layer component 210a, the metal layer component 220a, the semiconductor chips 250a and 250b, and the electric connections to protect them. The sealing material may be an epoxy mold compound (EMC) for example.

Figure 4A:
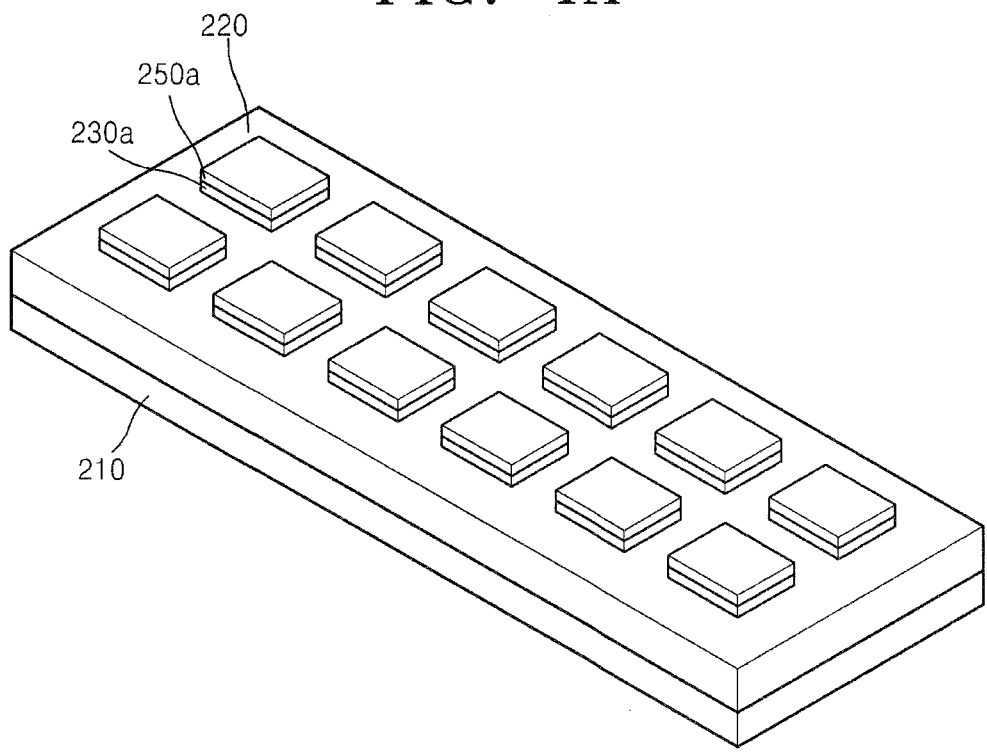
FIGS. 4A through 4E are perspective views illustrating a method of fabricating a semiconductor package according to another embodiment of the present invention.

FIGS. 4A through 4E are perspective views illustrating a method of fabricating a semiconductor package according to another embodiment of the present invention. Referring to FIG. 4A, solder paste components 230a and first semiconductor chips 250a are placed on a metal layer 220 in order to form an array of semiconductor chips (see FIGS. 3A through 3C for details).

Next, laminating is performed in order to attach a polymer layer 210 to the bottom of the metal layer 220. In the laminating process, the strength of a thin film is increased by attaching two or more types of thin film to each other. For example, if aluminum foil and polyethylene are attached to each other, it is possible to improve the strength or durability of the aluminum foil having weak strength or durability.

Figure 4B:
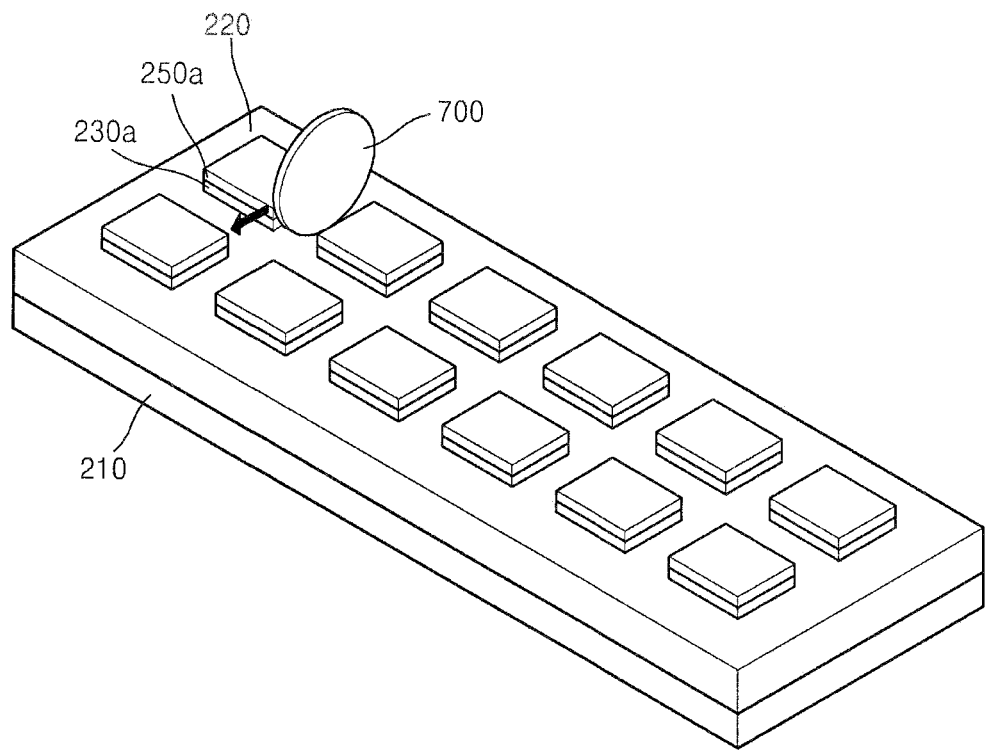

Referring to FIG. 4B, the singulation process is performed to cut through the metal layer 220 and the polymer layer 210 in order to separate the first semiconductor chips 250a from each other. The singulation process includes a process of cutting the metal layer 220 and the polymer layer 210 along the periphery of the first semiconductor chips 250a and in vertical and horizontal directions by using a cutting device 700.

Figure 4C:
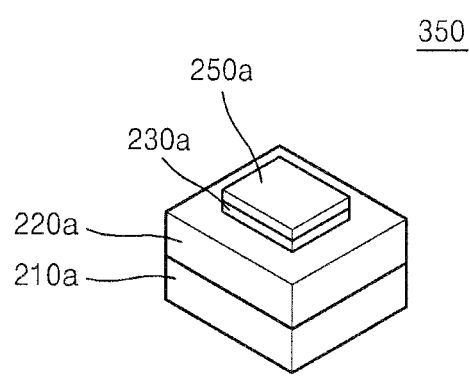

Referring to FIG. 4C, a second structure 350 in which the metal layer component 220a and the first semiconductor chip 250a are sequentially deposited is obtained on a polymer layer component 210a by performing the singulation process. The solder paste component 230a may be disposed between the metal layer component 220a and the first semiconductor chip 250a.

Figure 4D:
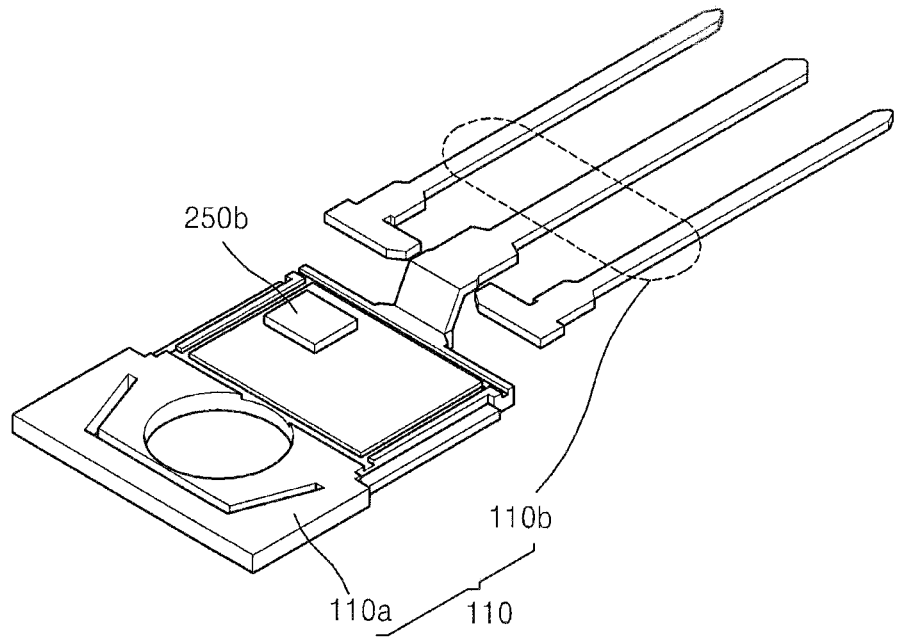

Referring to FIG. 4D, a second semiconductor chip 250b may be mounted on the base plate 110a. The polymer layer component 210a is not disposed between the second semiconductor chip 250b and the base plate 110a. Thus, the second semiconductor chip 250b may be electrically connected to the base plate 110a.

Figure 4E:
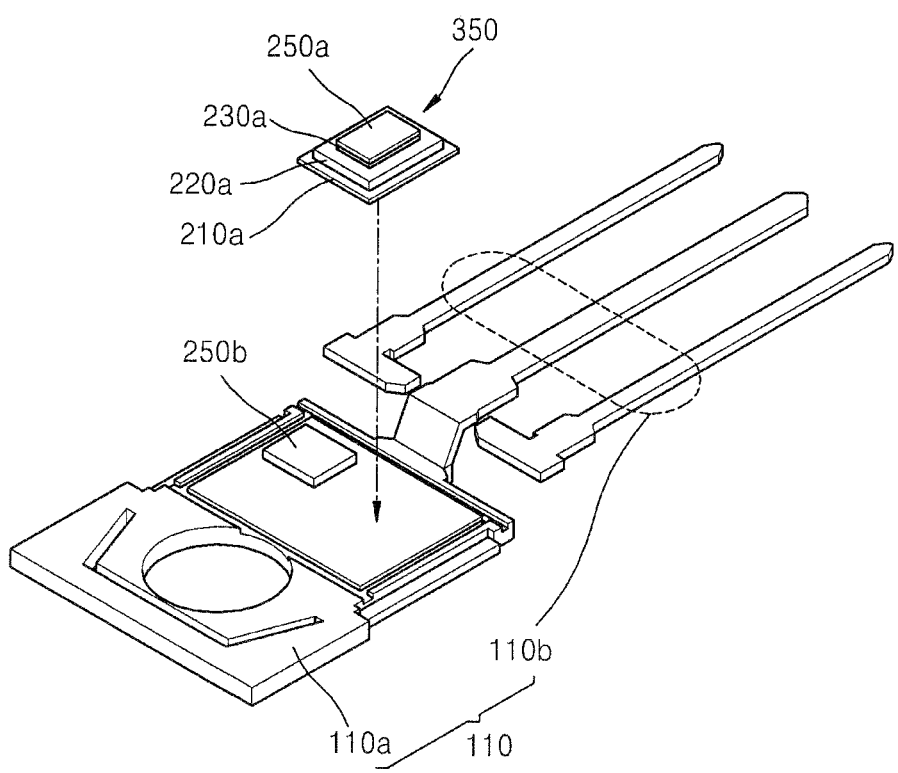

Referring to FIG. 4E, the second structure 350 is mounted on and attached to the base plate 110a. That is, the second structure 350 is mounted on the base plate 110a, and then, the curing process is performed in order to attach the second structure 350 to the base plate 110a.

Thereafter, electric connections and/or a sealing material may be added. The electric connections and the sealing material have been described above.

Figure 5A:
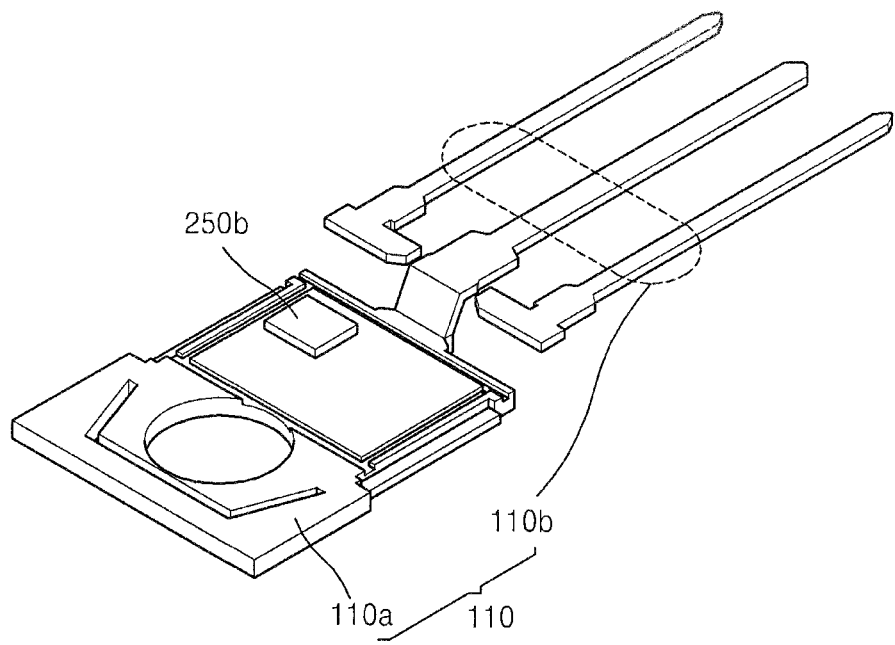
FIGS. 5A through 5D are perspective views illustrating a method of fabricating a semiconductor package according to still another embodiment of the present invention.

FIGS. 5A through 5D are perspective views illustrating a method of fabricating a semiconductor package according to another embodiment of the present invention. Referring to FIG. 5A, a second semiconductor chip 250b may be attached to a base plate 110a. A polymer layer component 210a having electrical insulating characteristics is not disposed between the second semiconductor chip 250b and the base plate 110a. Thus, the second semiconductor chip 250b is electrically connected to the base plate 110a.

Figure 5B:
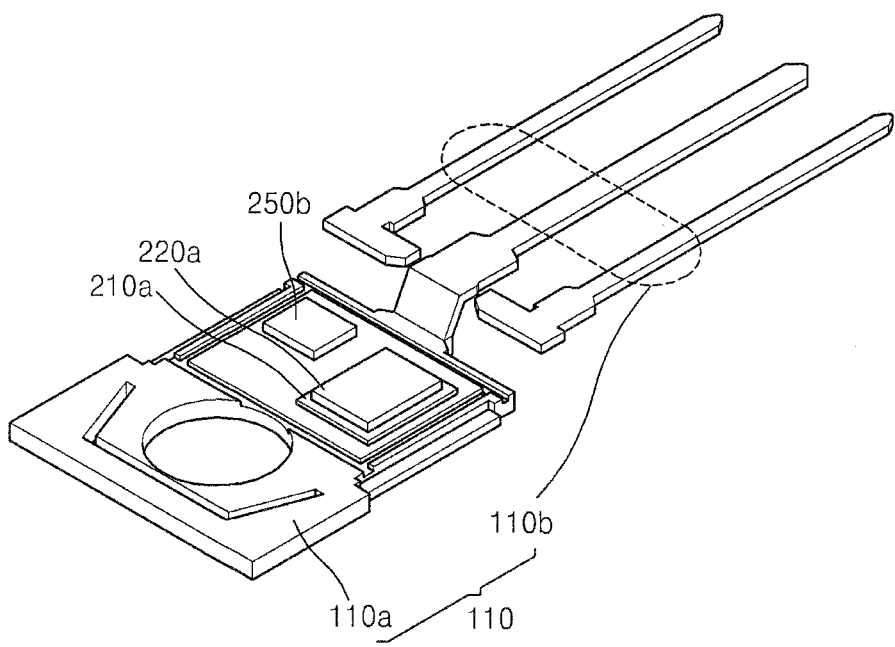

Referring to FIG. 5B, a third structure is attached to the base plate 110a. In the third structure, the metal layer component 220a is deposited on the polymer layer component 210a. The third structure is obtained by performing the laminating process to attach a polymer layer and a metal layer to each other and then performing the singulation process.

Figure 5C:
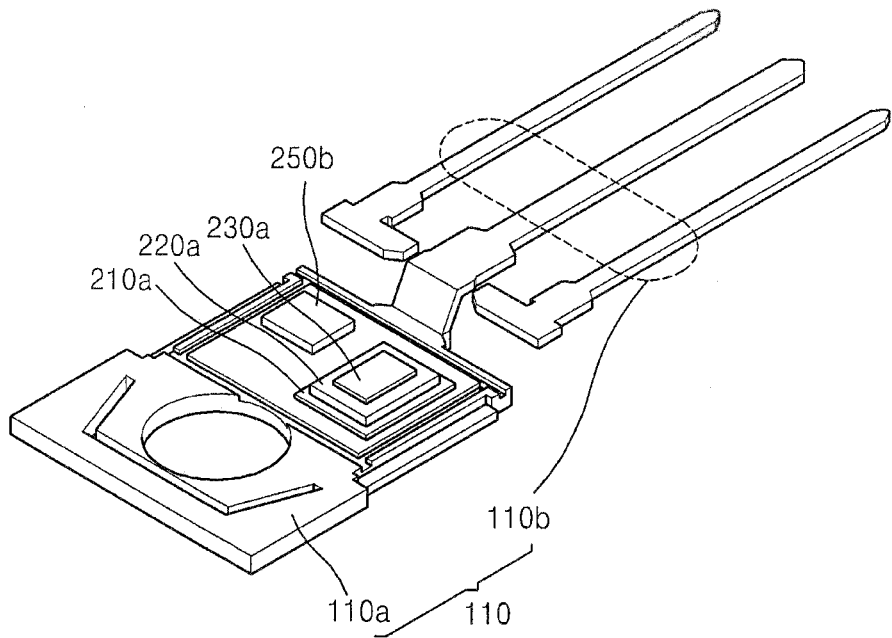

Referring to FIG. 5C, the solder paste component 230a is formed on the metal layer component 220a. An upper surface of the solder paste component 230a is preferably smaller than that of the metal layer component 220a.

Figure 5D:
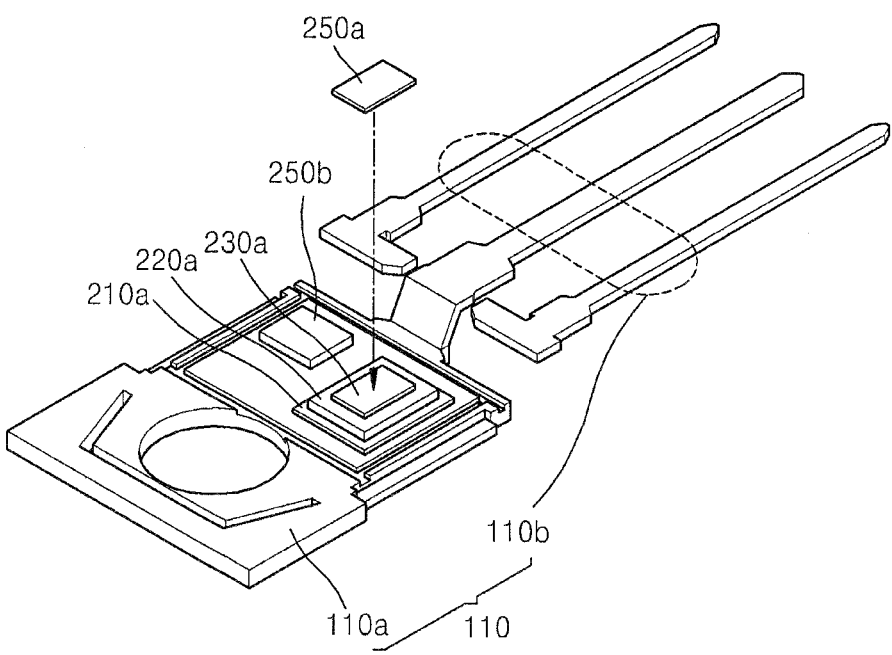

Referring to FIG. 5D, the first semiconductor chip 250a is arranged on the solder paste component 230a, and the reflow process is performed in order to attach the solder paste component 230a and the first semiconductor chip 250a to each other.

Thereafter, electric connections and/or a sealing material may be further added. The electric connections and the sealing material have been described above.

According to the above embodiments of the present invention, it is possible to fabricate a semiconductor package at low costs by employing an insulated structure having a high electric resistivity and a low thermal resistivity. That is, a polymer layer, which is easier to make than a DBC substrate manufactured at high costs, is employed as an insulated structure, thereby reducing manufacturing costs.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A semiconductor package comprising:
a lead frame having a base plate, a first lead, and a second lead, wherein the first lead and the second lead are spaced apart from the base plate;
a polymer layer component disposed on the base plate of the lead frame;
a metal layer component disposed on the polymer layer component and insulated from the base plate by the polymer layer component;
a first semiconductor chip disposed on the metal layer component;
a second semiconductor chip disposed on the base plate of the lead frame;
a first elongated metallic electrical conductor having a long and narrow body extending between one end and another end and connected at the one end in immediate physical contact with the first semiconductor chip and at the other end in immediate physical contact with the base plate;
a second elongated metallic electrical conductor having a long and narrow body extending from the one end to another end and connected at the one end in immediate physical contact with the metal layer and at the other end in immediate physical contact with the first lead; and
a third elongated metallic electrical conductor having a long and narrow body extending from one end to another end and connected at the one end in immediate physical contact with the second semiconductor chip and at the other end in immediate physical contact with the second lead.

2. The semiconductor package of claim 1 having no more than three leads.

3. The semiconductor package of claim 1, further comprising a third lead integral with the lead frame.

4. The semiconductor package of claim 3, wherein the third lead is between the first lead and the second lead.

5. The semiconductor package of claim 1, wherein the first elongated metallic electrical conductor directly connects the first semiconductor chip to the base plate; the second elongated metallic electrical conductor directly connects the metal layer to the first lead; and the third elongated metallic electrical conductor directly connects the second semiconductor chip to the second lead.

6. The semiconductor package of claim 1, wherein the polymer layer component comprises a polymer layer component having high thermal conductivity and good electric insulating characteristics.

7. The semiconductor package of claim 1, wherein the metal layer component contains copper.

8. The semiconductor package of claim 1, wherein the first semiconductor chip comprises one of a metal-oxide semiconductor field effect transistor (MOSFET), an insulated-gate bipolar transistor (IGBT), and a diode.

9. The semiconductor package of claim 1, wherein the first elongated metallic electrical conductor comprises one of a bonding wire, a ribbon wire and a metal clip.

10. The semiconductor package of claim 1, wherein the polymer layer component comprises a material formed by adding one compound selected from a group consisting of an aluminum nitride (AlN), and a boron nitride (BN) to an epoxy resin.

11. The semiconductor package of claim 1, wherein the first semiconductor chip comprises an electrical terminal formed on the top or bottom of the first semiconductor chip.

12. The semiconductor package of claim 1, wherein an upper surface of the first semiconductor chip is smaller than an upper surface of the metal layer component.

13. The semiconductor package of claim 1, wherein the first elongated metallic electrical conductor comprises bonding wire.

14. The semiconductor package of claim 1, wherein the first elongated metallic electrical conductor is formed of a material selected from a group consisting of gold, aluminum and copper.

15. The semiconductor package of claim 1, further comprising a solder paste layer component between the first semiconductor chip and the metal layer component.

16. The semiconductor package of claim 1, further comprising a sealing material sealing and protecting the polymer layer component, the metal layer component, and the semiconductor chip on the lead frame.

17. The semiconductor package of claim 1 wherein each elongated metallic electrical conductor may be any one of the group consisting of bond wires, wire ribbons and metal clips.

18. A semiconductor package comprising:
a lead frame having a base plate, a first lead, and a second lead, wherein the first lead and the second lead are spaced apart from the base plate;
a polymer layer component disposed on the base plate of the lead frame;
a metal layer component disposed on the polymer layer component and insulated from the base plate by the polymer layer component;
a first semiconductor chip disposed on the metal layer component;
a second semiconductor chip disposed on the base plate of the lead frame;
a first elongated metallic wire having a long and narrow body extending from one end to an other end and directly connected at the one end by immediate physical contact to the first semiconductor chip and directly connected at the other end by immediate physical contact to the base plate;
a second elongated metallic wire having a long and narrow body extending from one end to an other end and directly connected at the one end by immediate physical contact to the metal layer and directly connected at the other end by immediate physical contact to the first lead; and
a third elongated metallic wire having a long and narrow body extending from one end to an other end and directly connected at the one end by immediate physical contact to the second semiconductor chip and directly connected at the other end by immediate physical contact to the second lead.

19. The semiconductor package of claim 18 having no more than three leads.

20. The semiconductor package of claim 18 wherein each wire is either a bond wire or a wire ribbon.

21. A semiconductor package comprising:
a lead frame having a base plate, a first lead, and a second lead, wherein the first lead and the second lead are spaced apart from the base plate;
a polymer layer component disposed on the base plate of the lead frame;
a metal layer component disposed on the polymer layer component and insulated from the base plate by the polymer layer component;
a first semiconductor chip disposed on the metal layer component;
a second semiconductor chip disposed on the base plate of the lead frame;
a first metallic clip having a body extending from one end to an other end and directly connected at the one end by immediate physical contact to the first semiconductor chip and directly connected at the other end by immediate physical contact to the base plate;
a second elongated metallic clip having a body extending from one end to an other end and directly connected at the one end by immediate physical contact to the metal layer and directly connected at the other end by immediate physical contact to the first lead; and
a third elongated metallic clip having a body extending from one end to an other end and directly connected at the one end by immediate physical contact to the second semiconductor chip and directly connected at the other end by immediate physical contact to the second lead.

22. The semiconductor package of claim 21 having no more than three leads.

* * * * *